(12) United States Patent
Watanabe et al.

(10) Patent No.: US 10,947,451 B2
(45) Date of Patent: Mar. 16, 2021

(54) NITRIDE FLUORESCENT MATERIAL, METHOD OF PRODUCING NITRIDE FLUORESCENT MATERIAL AND LIGHT EMITTING DEVICE

(71) Applicant: NICHIA CORPORATION, Anan (JP)

(72) Inventors: Hiroyuki Watanabe, Itano-gun (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/779,642

(22) Filed: Feb. 2, 2020

(65) Prior Publication Data

US 2020/0172805 A1  Jun. 4, 2020

Related U.S. Application Data

(62) Division of application No. 15/682,987, filed on Aug. 22, 2017, now Pat. No. 10,590,342.

(30) Foreign Application Priority Data

Aug. 25, 2016 (JP) .................................. 2016-164813
Jul. 20, 2017 (JP) .................................. 2017-141066

(51) Int. Cl.
 *C09K 11/08* (2006.01)
 *H01L 33/50* (2010.01)
 *C09K 11/77* (2006.01)

(52) U.S. Cl.
 CPC ...... *C09K 11/7734* (2013.01); *C09K 11/0883* (2013.01); *H01L 33/502* (2013.01); *H01L 33/504* (2013.01)

(58) Field of Classification Search
 None
 See application file for complete search history.

(56) References Cited

U.S. PATENT DOCUMENTS

| | | | |
|---|---|---|---|
| 2006/0065878 A1 | 3/2006 | Sakane et al. | |
| 2007/0108896 A1* | 5/2007 | Hirosaki | C04B 35/584 313/506 |
| 2012/0080704 A1* | 4/2012 | Juang | C09K 11/7734 257/98 |

(Continued)

FOREIGN PATENT DOCUMENTS

| | | | |
|---|---|---|---|
| CN | 103555325 A | * | 2/2014 |
| CN | 103555325 A | | 2/2014 |

(Continued)

OTHER PUBLICATIONS

English translation of CN103555325A (Year: 2014).*

*Primary Examiner* — Xiaoming Liu
(74) *Attorney, Agent, or Firm* — Hunton Andrews Kurth LLP

(57) ABSTRACT

Provided is a method of producing a nitride fluorescent material containing silicon nitride particles containing Eu, at least one alkaline earth metal selected from the group consisting of Mg, Ca, Sr, and Ba, Al, and fluorine in a composition of the silicon nitride particles. The method includes heat treating a raw material mixture containing an Eu source, a source of the alkaline earth metal, an Al source, an Si source, and an alkaline earth metal fluoride containing at least one selected from the group consisting of Mg, Ca, Sr, and Ba, wherein a molar content ratio of fluorine atom to Al is from 0.02 to 0.3.

7 Claims, 3 Drawing Sheets

(56) References Cited

U.S. PATENT DOCUMENTS

| | | |
|---|---|---|
| 2013/0214314 A1 | 8/2013 | Wang et al. |
| 2016/0120003 A1* | 4/2016 | Chen ..................... H05B 33/06 |
| | | 313/503 |
| 2018/0057738 A1 | 3/2018 | Watanabe et al. |

FOREIGN PATENT DOCUMENTS

| | | |
|---|---|---|
| JP | 2006063214 A | 3/2006 |
| JP | 2008189700 A | 8/2008 |
| JP | 2010047774 A | 3/2010 |
| JP | 2014503605 A | 2/2014 |
| JP | 2014227454 A | 12/2014 |
| JP | 2018035346 A | 3/2018 |
| WO | 2015001860 A1 | 1/2015 |

* cited by examiner

NITRIDE FLUORESCENT MATERIAL, METHOD OF PRODUCING NITRIDE FLUORESCENT MATERIAL AND LIGHT EMITTING DEVICE

CROSS-REFERENCE TO RELATED APPLICATIONS

This is a divisional application of U.S. patent application Ser. No. 15/682,987, filed Aug. 22, 2017, which claims priority to Japanese Patent Application No. 2016-164813, filed on Aug. 25, 2016, and Japanese Patent Application No. 2017-141066, filed on Jul. 20, 2017, the disclosures of which are hereby incorporated by reference in their entirety.

BACKGROUND

Technical Field

This disclosure relates to a nitride fluorescent material, a method of producing the nitride fluorescent material, and a light emitting device.

Description of the Related Art

Light emitting devices including a light emitting diode (hereafter, "LED") in combination with a fluorescent material are increasingly used in a variety of applications including lighting systems and backlights for liquid crystal displays. Examples of the fluorescent material used in a light emitting device include nitride fluorescent materials, which contain nitrogen in their compositions. Known examples include a red fluorescent material including $CaAlSiN_3$ as a host crystal and activated with $Eu^{2+}$ (hereafter, "CASN fluorescent material"), and $(Sr,Ca)AlSiN_3$:Eu (hereafter, "SCASN fluorescent material"), which is a CASN fluorescent material in which a part of Ca is replaced with Sr. CASN fluorescent materials and SCASN fluorescent materials have a peak emission wavelength in a range as wide as from 600 nm to 670 nm depending on their compositions. These nitride fluorescent materials are useful for improving color rendering properties of lighting systems.

For example, International Patent Application Publication No. WO 2015/001860 describes a method, which includes adjusting an initial charge composition of raw materials of a fluorescent material, as a method of producing a nitride fluorescent material with improved emission intensity.

SUMMARY

A nitride fluorescent material and a method of producing the nitride fluorescent material are provided. The nitride fluorescent material includes silicon nitride particles containing, in their composition, Eu, at least one alkaline earth metal selected from the group consisting of Mg, Ca, Sr, and Ba, Al, and fluorine. The silicon nitride particles have a needle degree, which is an average of major diameter to minor diameter ratio, of from 1.4 to 1.8, a volume average particle diameter of 10 μm or more, and a molar content ratio of fluorine atom to Al of $6 \times 10^{-2}$ or less. The method of producing a nitride fluorescent material is a method of producing a nitride fluorescent material containing silicon nitride particles containing in their composition Eu, at least one alkaline earth metal selected from the group consisting of Mg, Ca, Sr, and Ba, Al, and fluorine. The method includes heat treating a raw material mixture containing an Eu source, a source of the alkaline earth metal, an Al source, an Si source, and an alkaline earth metal fluoride containing at least one selected from the group consisting of Mg, Ca, Sr, and Ba, wherein a molar content ratio of fluorine atom to Al is from 0.02 to 0.3.

DETAILED DESCRIPTION

Figure 1:
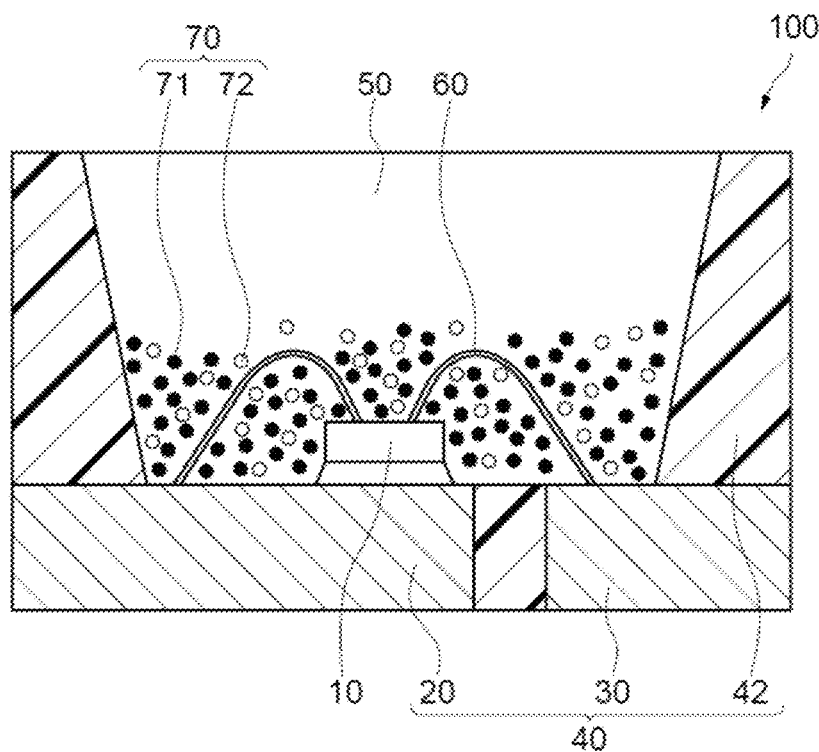
FIG. 1 is a schematic cross-sectional view of an exemplary light emitting device.

As described in International Patent Application Publication No. WO 2015/001860, merely adjusting the initial charge composition of the raw materials of a nitride fluorescent material may not fully improve the emission intensity of the nitride fluorescent material. In response to this, one embodiment according to the present disclosure is directed to a nitride fluorescent material having high emission efficiency, and a method of producing the nitride fluorescent material.

In view of the problem, the present inventors have noticed, as a result of intensive study, that adding a given amount of a specific compound to the raw materials of a nitride fluorescent material produces a nitride fluorescent material having high emission efficiency, and that a light emitting device including such a nitride fluorescent material exhibits high emission intensity. Specific means for solving the problem are as described below, and the present invention includes the embodiments given below.

A first embodiment is a method of producing a nitride fluorescent material including silicon nitride particles that contain, in their composition, Eu, at least one alkaline earth metal selected from the group consisting of Mg, Ca, Sr, and Ba, Al, and fluorine. The method includes heat treating a raw material mixture containing an Eu source, a source for the alkaline earth metal, an Al source, an Si source, and an alkaline earth metal fluoride containing at least one selected from the group consisting of Mg, Ca, Sr, and Ba, wherein a molar content ratio of fluorine atom to Al is from 0.02 to 0.3.

A second embodiment is a nitride fluorescent material including silicon nitride particles containing, in their composition, Eu, at least one alkaline earth metal selected from the group consisting of Mg, Ca, Sr, and Ba, Al, and fluorine. The silicon nitride particles have a needle degree, which is an average of major diameter to minor diameter ratio, of from 1.4 to 1.8, a volume average particle diameter of 10 μm or more, and a molar content ratio of fluorine atom to Al of $6 \times 10^{-2}$ or less.

A third embodiment is a light emitting device including a fluorescent member containing a first fluorescent material including the above-described nitride fluorescent material, and a light-emitting element having a peak light emission wavelength in a range of from 380 nm to 470 nm.

Embodiments of the present disclosure provide a nitride fluorescent material having high emission efficiency and a method of producing the nitride fluorescent material.

A nitride fluorescent material, a method of producing the nitride fluorescent material, and a light emitting device according to the present disclosure will now be described in accordance with embodiments. However, the embodiments described below are mere examples of the nitride fluorescent material, the production method, and the light emitting device for embodying the technical concept of the present invention, and the present invention is not limited to the embodiments including the nitride fluorescent material described below. The relationship between the color names and the chromaticity coordinates, the relationship between the wavelength ranges of light and the color names of monochromatic light, and others are in accordance with Japanese Industrial Standard (JIS) Z8110. For the amount of each component contained in a composition, when a plurality of substances corresponding to the component is present in the composition, the amount of the component means the total amount of the substances present in the composition unless otherwise specified.

Method of Producing Nitride Fluorescent Material

The method of producing a nitride fluorescent material includes heat treating a raw material mixture containing an Eu source, an alkaline earth metal source, an Al source, an Si source, and an alkaline earth metal fluoride containing at least one alkaline earth metal, wherein a molar content ratio of fluorine atom to Al is from 0.02 to 0.3. The nitride fluorescent material to be produced contains silicon nitride particles containing, in their composition, Eu, at least one alkaline earth metal element selected from the group consisting of Mg, Ca, Sr, and Ba, Al, and fluorine. Using a raw material mixture containing a specific amount of an alkaline earth metal fluoride in addition to the element sources typically used for producing a nitride fluorescent material allows the resulting fluorescent material to have a specific particle shape, and high emission efficiency.

The raw material mixture used in the method of producing the nitride fluorescent material contains an Eu source, an alkaline earth metal source containing at least one selected from the group consisting of Mg, Ca, Sr, and Ba, an Al source, an Si source, and an alkaline earth metal fluoride containing at least one selected from the group consisting of Mg, Ca, Sr, and Ba, wherein a molar content ratio of fluorine atom to Al is from 0.02 to 0.3.

Examples of the Eu source to be contained in the raw material mixture include a europium compound, a simple europium metal, and an alloy of europium. Examples of the europium compound include oxides, hydroxides, nitrides, oxynitrides, fluorides, and chlorides containing europium. Specific examples of the europium compound include europium oxide ($Eu_2O_3$), europium nitride (EuN), and europium fluoride ($EuF_3$), and at least one selected from the group consisting of these compounds is preferable. Using europium nitride (EuN), which is composed only of the elements of the target fluorescent material composition, can more effectively reduce impurities. Europium oxide ($Eu_2O_3$) and europium fluoride ($EuF_3$), which can serve as a flux, are preferably used. These europium compounds may be used individually, or two or more of them may be used in combination.

The europium compound may be selected from commercially available products as appropriate, or a desired europium compound may be produced for use. For example, europium nitride can be obtained by grinding europium to be used as a raw material in an inert gas atmosphere, and heat treating the resultant powder in a nitrogen atmosphere or an ammonium atmosphere to allow the powder to be nitrided. The average particle diameter of the ground europium is, for example, from 0.1 μm to 10 μm. The heat treating-temperature is, for example, from 600° C. to 1200° C., and the time period for heat treating is, for example from 1 hour to 20 hours. The resultant europium nitride may undergo, for example, grinding treatment in an inert gas atmosphere.

At least a portion of the Eu source in the raw material mixture may be replaced with a metal compound, a simple metal, or an alloy of rare-earth elements, such as scandium (Sc), yttrium (Y), lanthanum (La), cerium (Ce), praseodymium (Pr), neodymium(Nd), samarium (Sm), gadolinium (Gd), terbium (Tb), dysprosium (Dy), holmium (Ho), erbium (Er), thulium (Tm), ytterbium (Yb), and lutetium (Lu). Examples of the metal compound include oxides, hydroxides, nitrides, oxynitrides, fluorides, and chlorides.

The purity of the Eu source (e.g., europium compound) is, for example, 95% by weight or more, and preferably 99.5% by weight or more. With the purity equal to or greater than the predetermined value, the influence of impurities can be reduced to allow the resulting fluorescent material to have further improved emission intensity.

The alkaline earth metal in the alkaline earth metal source to be contained in the raw material mixture is at least one selected from the group consisting of Mg, Ca, Sr, and Ba. The alkaline earth metal preferably contains at least Sr and at least one selected from the group consisting of Mg, Ca, and Ba, and more preferably contains at least Sr and Ca.

Examples of the alkaline earth metal source include an alkaline earth metal compound, a simple alkaline earth metal, and an alloy of an alkaline earth metal. Examples of the alkaline earth metal compound include hydrides, oxides, hydroxides, nitrides, oxynitrides, chlorides, amide compounds, and imide compounds containing alkaline earth metal, and, for example, hydrides and nitrides are preferable. The alkaline earth metal source may include Li, Na, K, B, and Al as impurities.

The alkaline earth metal compound may be selected from commercially available products as appropriate, or a desired alkaline earth metal compound may be produced for use. For example, calcium nitride may be obtained by grinding calcium to be used as a raw material in an inert gas atmosphere, and heat treating the resultant powder in a nitrogen atmosphere to allow the powder to be nitrided. The heat treating-temperature is, for example, from 600° C. to 900° C., and the time period for heat treating is, for example, from 1 hour to 20 hours. The resulting calcium nitride may undergo, for example, grinding treatment in an inert gas atmosphere. Although strontium nitride can be obtained in the same manner as calcium nitride, the amount of nitrogen to be contained in strontium nitride can be changed in accordance with production conditions unlike calcium nitride.

The purity of the alkaline earth metal source (e.g., alkaline earth metal compound) is, for example, 95% by weight or more, and preferably 99.5% by weight or more. With the purity equal to or greater than the predetermined value, the influence of impurities can be reduced to allow the resulting fluorescent material to have further improved emission intensity.

Examples of the Al source to be contained in the raw material mixture include an aluminum compound, a simple aluminum metal, and an aluminum alloy. Examples of the aluminum compound include oxides, hydroxides, nitrides, oxynitrides, fluorides, and chlorides containing aluminum. Specific examples of the aluminum compound include aluminum nitride (AlN), aluminum oxide ($Al_2O_3$), and aluminum hydroxide ($Al(OH)_3$), and preferably at least one selected from the group consisting of these compounds is used, and more preferably aluminum nitride is used. Using aluminum nitride, which is composed only of the elements of the target fluorescent material composition, can more effectively reduce impurities. For example, in comparison with aluminum compounds containing oxygen or hydrogen, aluminum nitride can reduce the influence of these elements, and needs no nitriding reaction unlike simple metal. These aluminum compounds may be used individually, or two or more of them may be used in combination.

The aluminum compound may be selected from commercially available products as appropriate, or a desired aluminum compound may be produced for use. For example, aluminum nitride can be produced by, for example, direct nitridation of aluminum.

At least a portion of the Al source in the raw material mixture may be replaced with a metal compound, a simple metal, or an alloy of a Group III element, such as gallium, indium, vanadium, chromium, and cobalt. Examples of the metal compound include oxides, hydroxides, nitrides, oxynitrides, fluorides, and chlorides.

The purity of the Al source (e.g., aluminum compound) is, for example, 95% by weight or more, preferably 99% by weight or more. With the purity equal to or greater than the predetermined value, the influence of impurities can be reduced to allow the resulting fluorescent material to have further improved emission intensity.

Examples of the Si source to be contained in the raw material mixture include a silicon compound, and a simple silicon substance. Examples of the silicon compound include oxides, hydroxides, nitrides, oxynitrides, fluorides, and chlorides containing silicon. Specific examples of the silicon compound include silicon oxide, silicon nitride, silicon oxynitride, and silicate, and at least one selected from the group consisting of these compounds is preferable, and silicon nitride is more preferable. Using silicon nitride, which is composed only of the elements of the target fluorescent material composition, can more effectively reduce impurities. For example, in comparison with a silicon compound containing oxygen or hydrogen, silicon nitride can reduce the influence of these elements, and needs no nitriding reaction unlike simple metal. The silicon compounds may be used individually, or two or more of them may be used in combination.

The silicon compound may be selected from commercially available products as appropriate, or a desired silicon compound may be produced for use. For example, silicon nitride can be obtained by grinding silicon to be used as a raw material in an inert gas atmosphere, and heat treating the resulting powder in a nitrogen atmosphere to allow the powder to be nitrided. The heat-treating temperature is, for example, from 800° C. to 2000° C., and the time period for heat treating is, for example, from 1 hour to 20 hours. The resulting silicon nitride may undergo, for example, grinding treatment in an inert gas atmosphere.

At least a portion of the Si source in the raw material mixture may be replaced with a metal compound, a simple metal, or an alloy of a Group IV element, such as germanium, tin, titanium, zirconium, and hafnium. Examples of the metal compound include oxides, hydroxides, nitrides, oxynitrides, fluorides, and chlorides.

The purity of the Si source (e.g., silicon compound) is, for example, 95% by weight or more, and preferably 99% by weight or more. With the purity equal to or greater than the predetermined value, the influence of impurities can be reduced to allow the resulting fluorescent material to have further improved emission intensity.

The raw material mixture contains at least one alkaline earth metal fluoride. The alkaline earth metal contained in the alkaline earth metal fluoride is at least one selected from the group consisting of Mg, Ca, Sr, and Ba, preferably contains at least Sr and at least one selected from the group consisting of Mg, Ca, and Ba, and more preferably contains at least one of Sr and Ca. The alkaline earth metal fluoride content of the raw material mixture is such that the molar content ratio of fluorine atom to Al is from 0.02 to 0.3, preferably from 0.02 to less than 0.3, more preferably from 0.02 to 0.27, still more preferably from 0.03 to 0.18, and even more preferably from 0.04 to 0.13. With the molar content ratio equal to or greater than the lower limit, the effect as flux can fully be achieved. Some amount of flux is enough to achieve its maximum effect, and no more effect can be expected by further increasing the amount of flux. Thus, with the molar content ratio equal to or lower than the upper limit, the effect as flux can be obtained without containing excessive flux.

The purity of the alkaline earth metal fluoride is, for example, 95% by weight or more, and preferably 99% by weight or more. With the purity equal to or greater than the predetermined value, the influence of impurities can be reduced to allow the resulting fluorescent material to have further improved emission intensity. The alkaline earth metal fluoride may further contain, for example, Li, Na, K, B, or Al. The alkaline earth metal fluoride may be selected from commercially available products as appropriate, or a desired alkaline earth metal fluoride may be produced for use.

The raw material mixture may further contain, for example, other halides as flux in addition to the alkali metal earth fluoride. Examples of the halides include chlorides and fluorides of rare-earths and alkali metal. When the raw material mixture contains additional flux, the flux content relative to the alkali metal earth fluoride in the raw material is, for example, 20% by weight or less, preferably 10% by weight or less, and more preferably 1% by weight or less.

The raw material mixture may further contain separately prepared silicon nitride particles as appropriate. When the raw material mixture contains silicon nitride particles, the silicon nitride particle content of the raw material mixture is, for example, 1% by weight to 50% by weight.

The raw material mixture can be prepared by mixing the Eu source, the alkaline earth metal element source, the Al source, the Si source, and the alkaline earth metal fluoride in a predetermined quantitative ratio. The mixing ratio of the components in the raw material mixture may be determined for example such that i, j, k, l, m and n in the formula (Ia) below satisfy the requirements defined in the formula (Ia), and that the molar content ratio of fluorine atom to Al in the raw material mixture is from 0.02 to 0.3.

$$M^a{}_i Sr_j Eu_k Si_l Al_m N_n \qquad \text{(Ia)}$$

In the formula (Ia), $M^a$ is at least one selected from the group consisting of Ca, Ba, and Mg; and i, j, k, l, m and n satisfy $0 < i \le 1$, $0 \le j$, $0 < k \le 0.04$, $0.8 \le i+j+k \le 1.1$, $0.8 \le l \le 1.2$, $0.8 \le m \le 1.2$, $1.8 \le l+m \le 2.2$, and $2.5 \le n \le 3.2$.

The raw material mixture may be obtained by weighing the components to be included in the material mixture to have a desired compounding ratio, and then mixing the components by the method using a ball mill, or the method using a mixing machine, such as a Henschel mixer or a V-blender, or the method using a mortar and a pestle. The mixing may be dry mixing, or wet mixing by adding, for example, a solvent.

Heat treating the resulting raw material mixture produces a nitride fluorescent material containing silicon nitride particles with a desired shape, and having high emission intensity. The heat-treating temperature of the raw material mixture is, for example, 1200° C. or more, preferably 1500° C. or more, and more preferably 1900° C. or more. The heat-treating temperature is also, for example, 2200° C. or less, preferably 2100° C. or less, and more preferably 2050° C. or less. Heat treating at a temperature equal to or greater than the lower limit allows Eu to easily enter the crystal to efficiently form a desired nitride fluorescent material. Heat treating at a temperature equal to or lower than the upper limit may reduce degradation of the resulting nitride fluorescent material.

The atmosphere for heat treating the raw material mixture is preferably a nitrogen gas-containing atmosphere, and more preferably, essentially nitrogen gas atmosphere. A nitrogen gas-containing atmosphere allows nitriding of silicon contained in the raw material. Such an atmosphere can also suppress degradation of a nitride raw material and the resulting nitride fluorescent material. The atmosphere for heat treating the raw material mixture containing nitrogen gas may contain other gases, for example, hydrogen, a rare gas, such as argon, carbon dioxide, carbon monoxide, oxygen, and ammonia in addition to nitrogen gas. The nitrogen gas content of the atmosphere for heat treating the raw material mixture is, for example 90 volume % or more, and preferably 95 volume % or more. Limiting the gas content containing an element other than nitrogen to a predetermined value or less may prevent such a gaseous component from forming impurities and lowering the emission intensity of the fluorescent material.

The pressure for heat treating the raw material mixture may be, for example, from normal pressure to 200 MPa. To suppress degradation of the resulting nitride fluorescent material, the pressure is preferably high. The pressure is preferably from 0.1 MPa to 200 MPa, and more preferably from 0.6 MPa to 1.2 MPa as a gauge pressure with fewer restrictions on industrial equipment.

The raw material mixture may be heat-treated at a single temperature, or may be heat-treated step-wise at two or more heat treating temperatures. Heat-treating at multiple steps may include heat treating, for example, at a temperature of from 800° C. to 1400° C. in a first step followed by gradual raising of the temperature, and heat treating at a temperature of from 1500° C. to 2100° C. in a second step.

Heat-treating of the raw material mixture may be performed by raising the temperature from, for example, room temperature to a predetermined temperature. The period of time for raising the temperature is, for example, from 1 hour to 48 hours, preferably from 2 hours to 24 hours, and more preferably from 3 hours to 20 hours. With the time period for raising the temperature equal to or greater than the lower limit, the particle growth of silicon nitride particles, or the fluorescent material, may fully proceed, and Eu may easily enter the crystals of the fluorescent material particles.

Heat treating of the raw material mixture may have a retention time at a predetermined temperature. The retention time is, for example, from 0.5 hour to 48 hours, preferably from 1 hour to 30 hours, and more preferably from 2 hours to 20 hours. A retention time equal to or greater than the lower limit may further accelerate uniform particle growth. A retention time equal to or lower than the upper limit may further suppress degradation of the resulting fluorescent material.

The period of time for lowering the predetermined temperature to room temperature during heat treating of the raw material mixture is, for example, from 0.1 hour to 20 hours, preferably from 1 hour to 15 hours, and more preferably from 3 hours to 12 hours. A retention time at an appropriately selected temperature may be provided during the time period for lowering the temperature from a predetermined temperature to room temperature. The retention time may be adjusted, for example, to further improve the emission intensity of the resulting nitride fluorescent material. The retention time at a predetermined temperature during the time period for lowering the temperature is, for example, from 0.1 hour to 20 hours, and preferably from 1 hour to 10 hours. The temperature during the retention time is, for example, from 1000° C. to less than 1800° C., and preferably from 1200° C. to 1700° C.

The raw material mixture may be heat-treated by using, for example, a gas pressurized electric furnace. The raw material mixture may be heat-treated, for example, by filling the raw material mixture into, for example, a crucible or a boat formed from a carbon material, such as graphite, or a boron nitride (BN) material. In addition to a carbon material and a boron nitride material, for example, an alumina ($Al_2O_3$) material or an Mo material may be used. Of these, a crucible or a boat formed from a boron nitride material is preferable.

After heat treating the raw material mixture, a sizing step including crushing, grinding, and classifying of the nitride fluorescent material containing silicon nitride particles obtained through heat treating may be performed. Particles with a desired particle diameter may be obtained by the sizing step. Specifically, after roughly grinding the nitride fluorescent material, the resulting product may be ground using a typical grinder, such as a ball mill, a jet mill, or a vibration mill to have a predetermined particle diameter. Excessive grinding, however, may cause defects on the surface of the silicon nitride particles, resulting in a luminance drop. When particles having different particle diameters are present after grinding, the particles may be classified to have a uniform particle diameter.

Specifically, for example, the raw material mixture containing the components in the composition ratio of Sr:Ca:Eu:Al:Si=0.937:0.049:0.014:1.0:1.0 is heat-treated such that the molar content ratio of fluorine atom to Al is 0.06. This allows a resulting nitride fluorescent material containing silicon nitride particles to have a composition ratio of Sr:Ca:Eu:Al:Si reflecting the initial charge composition ratio of these components. The molar content ratio of fluorine atom to Al in the resulting nitride fluorescent material is $6\times10^{-2}$ or less and, for example, $1.9\times10^{-4}$. The composition of the fluorescent material actually synthesized may have a composition slightly different from the initial charge composition because of oxygen contained in the raw materials or, for example, degradation or scattering of the components during burning. Changing the ratio of combination of the raw materials allows the target fluorescent material to have a different composition.

Nitride Fluorescent Material

The nitride fluorescent material contains silicon nitride particles that contain in their composition Eu, at least one alkaline earth metal selected from the group consisting of Mg, Ca, Sr, and Ba, Al, and fluorine. The silicon nitride particles have a needle degree, which is an average of major diameter to minor diameter ratio, of from 1.4 to 1.8, a volume average particle diameter of 10 μm or more. The silicon nitride particles have a composition in which a molar content ratio of fluorine atom to Al is $6\times10^{-2}$ or less. The nitride fluorescent material containing silicon nitride particles having a specific composition and a specific shape has high emission efficiency and exhibits high emission intensity. The nitride fluorescent material containing such silicon nitride particles can be produced, for example, by the method of producing a nitride fluorescent material as described above.

The nitride fluorescent material produced by the production method described above has high internal quantum efficiency. The internal quantum efficiency of the nitride fluorescent material is, for example, 90% or more, and preferably 94% or more. The internal quantum efficiency of the nitride fluorescent material, which can be determined by using, for example, QE-2000 by Otsuka Electronics Co., Ltd., is the internal quantum efficiency when excited at 450 nm.

The silicon nitride particles in the nitride fluorescent material have a particle shape with a needle degree, which is an average of major diameter to minor diameter ratio, of from 1.4 to 1.8. The needle degree is preferably from 1.4 to 1.7, and more preferably from 1.4 to 1.65 in view of emission efficiency. The minor diameter and the major diameter of the silicon nitride particles are determined in a manner as described below on a planar image observed with a microscope. The major diameter of a particle is obtained as the maximum length of the particle observed. The maximum length of a particle is the maximum value of a line segment connecting two points on the outer periphery of the particle. The minor diameter of a particle is determined as a distance between two straight lines parallel in the direction of the major diameter and in contact with the outer periphery of the particle. A needle degree is calculated as an average of major diameter to minor diameter ratio of at least 20 particles.

The volume average particle diameter of the silicon nitride particles is 10 μm or more, preferably 13 μm or more, and more preferably 14 μm or more in view of emission efficiency. The volume average particle diameter is also, for example, 30 μm or less, and preferably 28 μm or less. The silicon nitride particles having a greater volume average particle diameter may have a higher absorption rate of excitation light and higher emission efficiency. Applying the nitride fluorescent material containing such silicon nitride particles having superior optical properties to a light emitting device described later produces a light emitting device with further improved emission efficiency. The nitride fluorescent material preferably contains the silicon nitride particles with the above-described volume average particle diameter value at a high frequency. In other words, the nitride fluorescent material preferably has a particle size distribution in a narrow range. Using a fluorescent material with a narrow particle size distribution produces a light emitting device with less color unevenness and more favorable color tone.

A volume average particle diameter of the silicon nitride particles and that of the other fluorescent material particles are determined as follows: the particle size distributions for the respective particles are obtained by the pore electrical resistance method (the electrical sensing zone method) based on the Coulter principle using a particle size distribution measuring device, and the volume median diameters (Dm) of the respective particles are obtained as a median diameter corresponding to a cumulative volume of 50% from a minor diameter side of the particle.

The value obtained by dividing a needle degree by a volume average particle diameter of the silicon nitride particles is, for example, 0.085 to 0.13, preferably 0.085 to 0.12, and more preferably 0.085 to 0.11 in view of emission efficiency.

The silicon nitride particles contain, in their composition, aluminum and fluorine atoms. The molar content ratio of fluorine atom to aluminum is 0.06 ($6\times10^{-2}$) or less, for example, $5.5\times10^{-2}$ or less, preferably $4\times10^{-2}$ or less, more preferably $2.5\times10^{-2}$ or less, and still more preferably $1.5\times10^{-2}$ or less in view of emission efficiency. The molar content ratio of fluorine atom to aluminum is also, for example, greater than 0, preferably $1\times10^{-5}$ or more, more preferably $3\times10^{-5}$ or more, still more preferably $5\times10^{-5}$ or more, furthermore preferably $1\times10^{-4}$ or more, and particularly preferably $1.5\times10^{4}$ or more.

The molar content ratio of nitrogen atom to aluminum in the silicon nitride particles is, for example, from 2.5 to 3.2, and preferably from 2.7 to 3.1 in view of emission efficiency. The molar content ratio of fluorine atom to nitrogen atom is, for example, from $3\times10^{-6}$ to $2.4\times10^{-2}$, and preferably from $1\times10^{-5}$ to $6\times10^{-3}$ in view of emission efficiency.

The nitride fluorescent material may contain an oxygen component. The oxygen component may be contained, for example, in the silicon nitride particles themselves, or in the form of, for example, an oxide or an oxynitride of, for example, an alkaline earth metal, aluminum, or silicon. When the nitride fluorescent material contains the oxygen component, the molar content ratio of oxygen atom to aluminum in the nitride fluorescent material containing an oxygen component is, for example, $5\times10^{-2}$ or more, preferably $6\times10^{-2}$ or more, more preferably $7\times10^{-2}$ or more, and is also, for example, $5\times10^{-1}$ or less, preferably $4\times10^{4}$ or less, more preferably $3\times10^{-1}$ or less, still more preferably $1\times10^{4}$ or less, and particularly preferably $8.5\times10^{-2}$ or less in view of, for example, emission efficiency. The molar content ratio of fluorine atom to oxygen atom is, for example, from $2\times10^{-5}$ to 1.2, preferably from $1\times10^{-4}$ to $2.5\times10^{-1}$, and more preferably from $1\times10^{-3}$ to $1\times10^{-2}$. Further, the molar content ratio of oxygen atom to nitrogen atom is, for example, from $1\times10^{-2}$ to $2\times10^{-1}$, preferably from $2\times10^{-2}$ to $1.1\times10^{-1}$, and more preferably from $2\times10^{-2}$ to less than $3\times10^{-2}$.

The silicon nitride particles may have a composition represented by, for example, formula (I) below.

$$M^a{}_sSr_tEu_uSi_vAl_wN_xO_yF_z \qquad (I)$$

In the formula (I), $M^a$ is at least one selected from the group consisting of Ca, Ba and Mg; and s, t, u, v, w x, y, and z respectively satisfy $0<s\leq1$, $0\leq t<1$, $0<u\leq0.04$, $0.8\leq s+t+u\leq1.1$, $0.8\leq v\leq1.2$, $0.8\leq w\leq1.2$, $1.8\leq v+w\leq2.2$, $2.5\leq x\leq3.2$, $0\leq y\leq0.5$, $0\leq z\leq0.06$, and $2.5\leq x+y+z\leq3.2$.

In the formula (I), $M^a$ preferably contains at least Ca in view of emission intensity. When $M^a$ contains Ca, the total molar ratio of Ca contained in $M^a$ is, for example, 85 mol % or more, and preferably 90 mol %.

The nitride fluorescent material absorbs light in the ultraviolet region to visible light in the short wavelength region or light in the range of 250 nm to 500 nm. Using an excitation light source having a peak light emission wavelength in this range produces a light emitting device with high emission efficiency. In particular, using an excitation light source having a main peak emission wavelength in the range of from 250 nm to 410 nm or from 410 nm to 480 nm is preferable, and using an excitation light source having a main peak light emission wavelength in the range of from 420 nm to 470 nm is more preferable. The emission spectrum of the nitride fluorescent material has a peak emission wavelength of, for example, in the range of from 600 nm to 670 nm, and preferably in the range of from 610 nm to 660 nm. The half bandwidth in the emission spectrum of the nitride fluorescent material is, for example, from 70 nm to 95 nm, and preferably from 70 nm to 90 nm.

In the nitride fluorescent material, europium (Eu), which is a rare-earth, is a light emission center. However, the light emission center according to the present embodiment is not limited to europium, but europium partially replaced with another rare-earth metal or an alkaline earth metal and coactivated with Eu can also be used. $Eu^{2+}$, which is a bivalent rare earth ion, stably exists in an appropriately selected host, and exhibits light emission effect.

The nitride fluorescent material preferably has a structure with high crystallinity in at least a portion of the material. For example, in the case of a glass body (amorphous), which has a loose structure and low crystallinity, unless the reaction conditions in the production process are controlled to be strictly uniform, the ratio of components in the resulting fluorescent material varies, causing, for example, uneven chromaticity. In contrast, the nitride fluorescent material according to the present embodiment, which has a structure with high crystallinity in at least a portion of the material, may be more easily produced and processed. In addition, the nitride fluorescent material is easily and uniformly dispersed in an organic medium. This allows easy preparation of, for example, a light emitting plastic and a polymer thin film material. Specifically, for example, 50% by weight or more, and more preferably 80% by weight or more of the nitride fluorescent material has a structure with crystallinity. This indicates a proportion of a luminous crystal phase. A crystal phase of 50% by weight or more is preferable to obtain light emission enough for practical use. Thus, the emission efficiency improves as the crystal phase increases. Thus, the high proportion of crystal phase in the nitride fluorescent material according to the present embodiment allows the material to have still higher emission intensity, and to be more easily processed.

Light Emitting Device

A light emitting device 100 according to an embodiment of the present disclosure will now be described in detail with reference to FIG. 1. The light emitting device 100 is an example surface-mounting type light emitting device. The light emitting device 100 includes a light-emitting element 10, and a molded body 40 on which the light-emitting element 10 is disposed. The light-emitting element 10 is a gallium nitride compound-semiconductor, which emits visible light at short-wavelengths (e.g., a range of from 380 nm to 485 nm) and has a peak emission wavelength in the range of 380 nm to 470 nm. The molded body 40 includes a first lead 20 and a second lead 30, and a resin portion 42 in an integral manner. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescent member 50. The fluorescent member 50 includes a first fluorescent material 71 and a second fluorescent material 72 as a fluorescent material 70, and a resin. The fluorescent material 70 converts the wavelength of light from the light emitting element 10.

The peak light emission wavelength of the light-emitting element 10 is in the range of 380 nm to 470 nm, and preferably in the range of 400 nm to 460 nm. Using the light-emitting element 10 having a peak light emission wavelength in this range as an excitation light source produces a light emitting device 100 that emits mixed light of light from the light-emitting element 10 and fluorescent light from the fluorescent material 70. Further, this structure effectively uses a part of light emitted from the light-emitting element 10 as a part of light to be emitted from the light emitting device to the outside, and produces a light emitting device 100 having high emission efficiency.

The half bandwidth of the emission spectrum of the light-emitting element 10 can be, for example, 30 nm or less. For example, a semiconductor light emitting element including a nitride semiconductor ($In_XAl_YGa_{1-X-Y}N$ wherein X and Y satisfy $0 \le X$, $0 \le Y$, and $X+Y \le 1$) is preferably used as the light emitting element 10. Using a semiconductor light emitting element as the excitation light source provides a highly efficient light emitting device that has high output linearity to the input and is stable and resistant to mechanical impact.

The fluorescent member 50 contains at least the first fluorescent material 71, and may contain another fluorescent material as appropriate, and a resin. The details of the nitride fluorescent material contained in the first fluorescent material 71 are as described above, and the preferred embodiments are the same.

The fluorescent member 50 may contain the second fluorescent material 72 in addition to the first fluorescent material 71. The fluorescent member 50 containing the second fluorescent material 72 produces the light emitting device 100 that emits mixed light of light from light-emitting element 10, the first fluorescent material 71, and the second fluorescent material 72.

The second fluorescent material 72 may have a composition represented by, for example, any one of formulas (IIa) to (IIi) below, and preferably contains at least one fluorescent material having a composition represented by a formula selected from the group consisting of these formulas, and more preferably contains at least one fluorescent material having a composition represented by formula (IIa) or (IIe) to produce a light emitting device having high color rendering properties and high emission efficiency. The light emitting device may contain a single second fluorescent material 72, or two or more second fluorescent materials 72 in combination.

| | |
|---|---|
| $(Y,Gd,Tb,Lu)_3(Al,Ga)_5O_{12}:Ce$ | (IIa) |
| $(Ba,Sr,Ca)_2SiO_4:Eu$ | (IIb) |
| $Si_{6-p}Al_pO_pN_{8-p}:Eu(0<p\le4.2)$ | (IIc) |
| $(Ca,Sr)_8MgSi_4O_{16}(Cl,F,Br)_2:Eu$ | (IId) |
| $(La,Y)_3Si_6N_{11}:Ce$ | (IIe) |
| $(Ba,Sr,Ca)Ga_2S_4:Eu$ | (IIf) |
| $(Ba,Sr,Ca)_2Si_5N_8:Eu$ | (IIg) |
| $(Sr,Ca,Ba)LiAl_3N_4:Eu$ | (IIh) |
| $K_2(Si,Ge,Ti)F_6:Mn$ | (IIi) |

The average particle diameter of the second fluorescent material 72 is, for example, from 2 μm to 35 μm, and preferably from 5 μm to 30 μm. With the second fluorescent material 72 having an average particle diameter equal to or greater than the lower limit, the material absorbs more light from the excitation light source, and emits light with high emission intensity and desired chromaticity. With the second fluorescent material 72 having an average particle diameter equal to or lower than the upper limit, which is to be contained in the fluorescent member 50, which is to be included in the light emitting device 100, the workability in the production of the light emitting device 100 improves.

The fluorescent member 50 may contain at least one resin in addition to the first fluorescent material 71. Examples of the resin include epoxy resin and silicone resin.

The fluorescent member 50 may contain other components as appropriate in addition to the first fluorescent material 71. Examples of the other components include a filler, such as silica, barium titanate, titanium oxide, or aluminum oxide, a light stabilizer, and a colorant. When the fluorescent member 50 contains other components, for example, a filler as an additional component, the filler content relative to 100 parts by weight of resin may be 0.01 to 20 parts by weight.

EXAMPLES

The present invention will now be described in detail with reference to examples, but the present invention is not limited to these examples.

Example 1

$Ca_3N_2$, $CaF_2$, $SrN_x$ (x=equivalent to ⅔), AlN, $Si_3N_4$, and EuN were used as raw materials, and weighed and mixed in an inert atmosphere glovebox to have an initial charge molar ratio of $Ca(Ca_3N_2):Ca(CaF_2):Sr:Eu:Al:Si:F=0.019:0.03:0.937:0.014:1:1:0.06$ to obtain a raw material mixture. The raw material mixture was filled into a crucible, and then heat-treated at from 1900° C. to 2100° C. in a nitrogen gas atmosphere with a gauge pressure of 0.92 MPa. Subsequently, the mixture underwent treatments such as crushing, dispersing, and classifying to obtain powder of a nitride fluorescent material E1 of Example 1 as a fluorescent material having a composition represented by $Ca_sSr_tEu_u Si_vAl_wN_xO_yF_z$.

Comparative Example 1

Powder of a nitride fluorescent material C1 was obtained under the same conditions as in Example 1 except that instead of using $CaF_2$, $Ca_3N_2$ alone was used as Ca source.

Example 2

Powder of a nitride fluorescent material E2 was obtained under the same conditions as in Example 1 except that the molar ratio as the initial charged amount ratio of the raw materials was adjusted to $Ca(Ca_3N_2):Ca(CaF_2):Sr:Eu:Al:Si:F=0.069:0.03:0.887:0.015:1:1:0.06$.

Comparative Example 2

Powder of a nitride fluorescent material C2 was obtained under the same conditions as in Example 2 except that instead of using $CaF_2$, $Ca_3N_2$ alone was used as Ca source.

Example 3

Powder of a nitride fluorescent material E3 was obtained under the same conditions as in Example 1 except that the molar ratio as the initial charged amount ratio of the raw materials was adjusted to $Ca(Ca_3N_2):Ca(CaF_2):Sr:Eu:Al:Si:F=0.118:0.03:0.837:0.015:0.9:1:0.06$.

Comparative Example 3

Powder of a nitride fluorescent material C3 was obtained under the same conditions as in Example 3 except that instead of using $CaF_2$, $Ca_3N_2$ alone was used as Ca source.

Example 4

Powder of a nitride fluorescent material E4 was obtained under the same conditions as in Example 1 except that the molar ratio as the initial charged amount ratio of the raw materials was adjusted to $Ca(Ca_3N_2):Ca(CaF_2):Sr:Eu:Al:Si:F=0.147:0.03:0.808:0.015:1:1:0.06$.

Comparative Example 4

Powder of a nitride fluorescent material C4 was obtained under the same conditions as in Example 4 except that instead of using $CaF_2$, $Ca_3N_2$ alone was used as Ca source.

Example 5

Powder of a nitride fluorescent material E5 was obtained under the same conditions as in Example 1 except that the molar ratio as the initial charged amount ratio of the raw materials was adjusted to $Ca(Ca_3N_2):Ca(CaF_2):Sr:Eu:Al:Si:F=0.167:0.03:0.786:0.017:0.9:1:0.06$.

Comparative Example 5

Powder of a nitride fluorescent material C5 was obtained under the same conditions as in Example 5 except that instead of using $CaF_2$, $Ca_3N_2$ alone was used as Ca source.

Table 1 shows the initial charged amount ratio of the raw materials and the results of the evaluations as described below of Examples 1 to 5 and Comparative Examples 1 to 5. In Table 1, $Ca_3N_2$ is abbreviated to Ca(N), and $CaF_2$ is abbreviated to Ca(F).

Evaluation

Volume Average Particle Diameter

The volume average particle diameter (Dm, median diameter) of each nitride fluorescent material was measured using a particle size distribution measuring device (Multisizer manufactured by Beckman Coulter Inc.) by the pore electrical resistance method (the electrical sensing zone method) based on the Coulter principle.

Light Emission Properties

Figure 2:
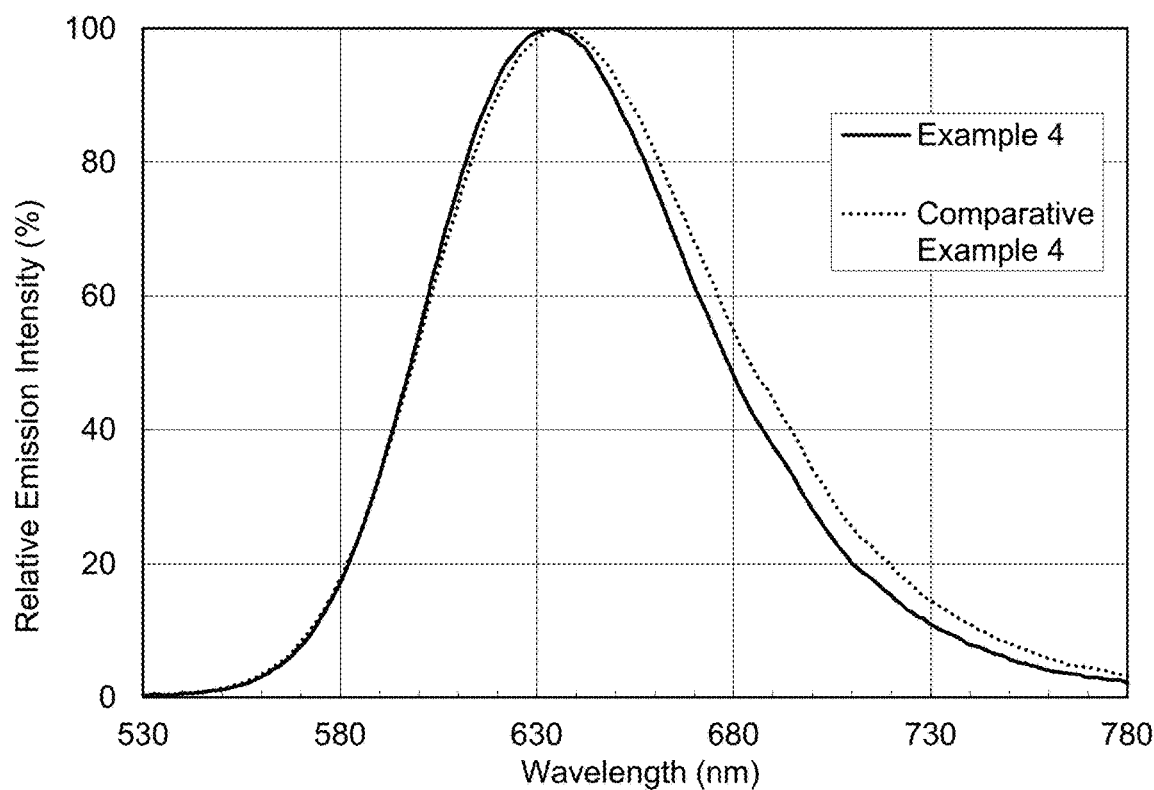
FIG. 2 shows emission spectra of a nitride fluorescent material according to an embodiment of the present disclosure and a comparative nitride fluorescent material.

The emission properties of the powder of each nitride fluorescent material were determined by a fluorescence evaluation device: QE-2000 (manufactured by Otsuka Electronics) using excitation light at a wavelength of 450 nm. From the resultant emission spectra, the relative emission intensity (relative Ip: %), the peak wavelength (λp: nm), and the internal quantum efficiency (%) of each nitride fluorescent material were obtained. Table 1 shows the results. The relative emission intensity of each nitride fluorescent material was measured using the nitride fluorescent material of each corresponding comparative example having the same initial charge composition as a reference. FIG. 2 shows the emission spectra of the nitride fluorescent materials obtained in Comparative Example 4 and Example 4.

Needle Degree

For each nitride fluorescent material obtained, the image of the fluorescent material particles was captured using an SEM or an optical microscope at a magnification of ×400. When capturing an image, the number of the particles in the samples was adjusted not to have particles overlapped with one another as much as possible. The image captured then underwent image processing with WinROOF 2013 by Mitani Corporation. At an initial stage of image processing, overlapped fluorescent material particles, partially captured fluorescent material particles, and obviously small fluorescent material particles were removed, and the particle shape and the needle degree were determined for each nitride fluorescent material. The ratio of major diameter to minor diameter was obtained for at least 20 particles, and a needle degree was calculated as an average value of these 20 particles.

Molar Content Ratio

Each nitride fluorescent material obtained underwent analyses of the components through fluorescent X-ray analysis (XRF) using an instrument manufactured by Rigaku Corporation; ion chromatography (IC) using an instrument manufactured by Japan Dionex Corporation; and oxygen·nitrogen analysis using an instrument manufactured by Horiba Ltd., and the molar content ratio of nitrogen atom (N), oxygen atom (O) and fluorine atom (F) to aluminum were each calculated. Tables 2 and 3 show the values of analytical composition relative to Al for the nitride fluorescent materials obtained in Examples and Comparative Examples. In these Tables, "1.9E-4" refers to "1.9×10$^{-4}$", and similar abbreviation applies to the other descriptions.

TABLE 2

|  | Sr | Ca | Eu | Al | Si | N | O | F |
|---|---|---|---|---|---|---|---|---|
| Example 1 | 0.887 | 0.063 | 0.014 | 1 | 1.019 | 2.885 | 7.0E-02 | 1.9E-04 |
| Example 2 | 0.838 | 0.107 | 0.015 | 1 | 1.037 | 2.914 | 7.4E-02 | 1.9E-04 |
| Example 3 | 0.816 | 0.168 | 0.017 | 1 | 1.091 | 3.021 | 7.3E-02 | 1.9E-04 |
| Example 4 | 0.752 | 0.184 | 0.015 | 1 | 1.042 | 2.936 | 7.5E-02 | 2.8E-04 |
| Example 5 | 0.751 | 0.215 | 0.018 | 1 | 1.095 | 2.987 | 8.1E-02 | 3.8E-04 |

TABLE 3

|  | Sr | Ca | Eu | Al | Si | N | O | F |
|---|---|---|---|---|---|---|---|---|
| Comparative Example 1 | 0.887 | 0.063 | 0.014 | 1 | 1.019 | 2.853 | 1.2E-01 | 0 |
| Comparative Example 2 | 0.838 | 0.107 | 0.015 | 1 | 1.037 | 2.883 | 1.2E-01 | 0 |
| Comparative Example 3 | 0.816 | 0.168 | 0.017 | 1 | 1.091 | 2.920 | 8.9E-02 | 0 |
| Comparative Example 4 | 0.752 | 0.184 | 0.015 | 1 | 1.042 | 2.898 | 1.5E-01 | 0 |
| Comparative Example 5 | 0.751 | 0.215 | 0.018 | 1 | 1.095 | 3.028 | 1.3E-01 | 0 |

As shown in Table 1, the nitride fluorescent materials obtained in Examples 1 to 5 each have an internal quantum efficiency equal to or greater than their corresponding nitride fluorescent materials obtained in Comparative Examples 1 to 5, showing their superior emission properties. Further, as shown in FIG. 2, the nitride fluorescent material obtained in Example 4 has a narrower half bandwidth of emission spectrum than the nitride fluorescent material obtained in Comparative Example 4. As a reason for this, for example, calcium fluoride used in Example 4 is inferred to have contributed to higher uniformity of crystals.

The volume average particle diameter Dm of each nitride fluorescent material is about 15 μm to 20 μm in the Examples and Comparative Examples. The needle degrees, which numerically represent the particle shapes, of the nitride fluorescent materials obtained in the Examples are in the range of from 1.4 to 1.8, which are higher than the needle degrees of the nitride fluorescent materials obtained in the Comparative Examples.

TABLE 1

|  | Initial charged amount ratio (mol) | | | | | | | Nitride fluorescent material | Volume average particle diameter (μm) | Needle degree | Needle degree/ Volume average particle diameter | Emission properites | |
|---|---|---|---|---|---|---|---|---|---|---|---|---|---|
|  | Ca(N) | Ca(F) | Sr | Eu | Al | Si | F |  |  |  |  | λp (nm) | Relative lp (%) | Internal quantum efficiency (%) |
| Example 1 | 0.019 | 0.03 | 0.937 | 0.014 | 1 | 1 | 0.06 | E1 | 16.6 | 1.52 | 0.092 | 621 | 99.2 | 95.1 |
| Comparative Example 1 | 0.049 | 0 | 0.937 | 0.014 | 1 | 1 | 0 | C1 | 20.5 | 1.33 | 0.065 | 621 | 100.0 | 95.1 |
| Example 2 | 0.069 | 0.03 | 0.887 | 0.015 | 1 | 1 | 0.06 | E2 | 15.6 | 1.55 | 0.099 | 624 | 103.4 | 97.2 |
| Comparative Example 2 | 0.099 | 0 | 0.887 | 0.015 | 1 | 1 | 0 | C2 | 18.4 | 1.33 | 0.072 | 624 | 100.0 | 94.1 |
| Example 3 | 0.118 | 0.03 | 0.837 | 0.015 | 0.9 | 1 | 0.06 | E3 | 15.1 | 1.63 | 0.108 | 627 | 103.9 | 96.9 |
| Comparative Example 3 | 0.148 | 0 | 0.837 | 0.015 | 0.9 | 1 | 0 | C3 | 15.2 | 1.35 | 0.089 | 627 | 100.0 | 93.5 |
| Example 4 | 0.147 | 0.03 | 0.808 | 0.015 | 1 | 1 | 0.06 | E4 | 15.0 | 1.50 | 0.100 | 634 | 111.9 | 94.6 |
| Comparative Example 4 | 0.177 | 0 | 0.808 | 0.015 | 1 | 1 | 0 | C4 | 21.0 | 1.36 | 0.065 | 634 | 100.0 | 85.2 |
| Example 5 | 0.167 | 0.03 | 0.786 | 0.017 | 0.9 | 1 | 0.06 | E5 | 16.5 | 1.43 | 0.087 | 640 | 109.8 | 95.6 |
| Comparative Example 5 | 0.197 | 0 | 0.786 | 0.017 | 0.9 | 1 | 0 | C5 | 18.6 | 1.34 | 0.072 | 640 | 100.0 | 86.1 |

Figure 3:
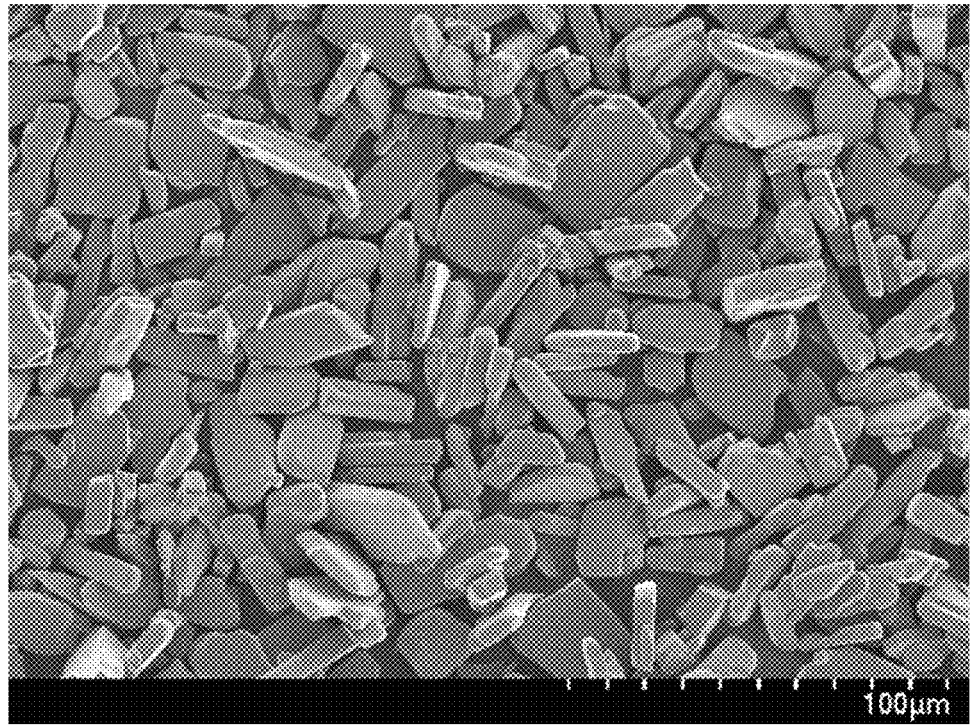
FIG. 3 is a scanning electron microscope (SEM) image of a nitride fluorescent material according to an embodiment of the present disclosure.
Figure 4:
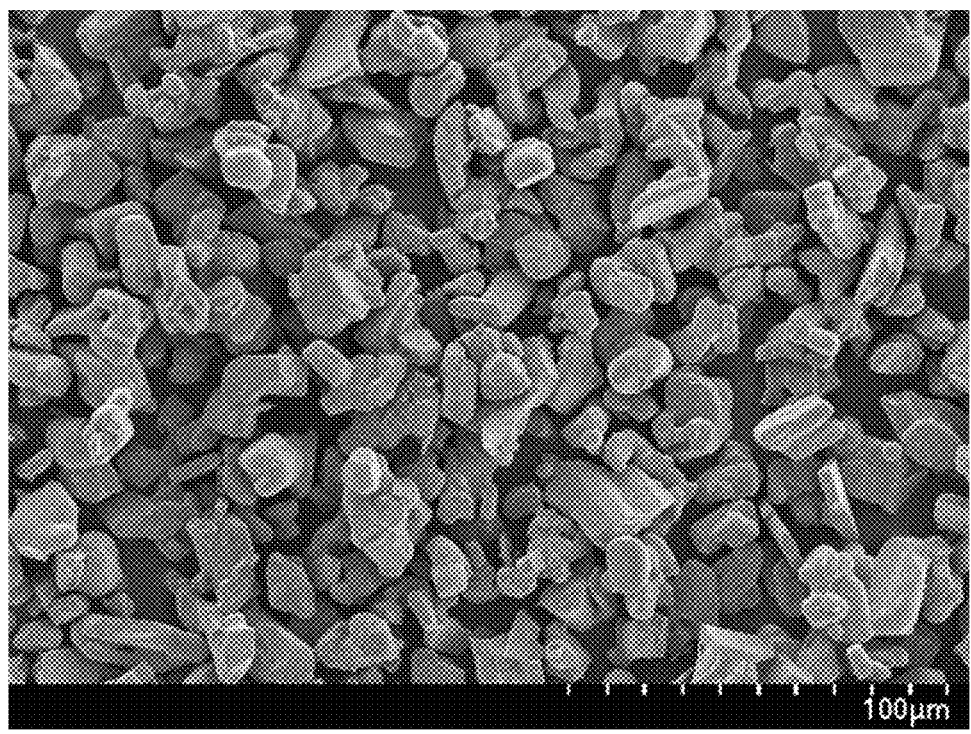
FIG. 4 is an SEM image of a comparative nitride fluorescent material.

FIG. 3 shows an SEM image of the nitride fluorescent material obtained in Example 1, whereas FIG. 4 shows an SEM image of the nitride fluorescent material obtained in Comparative Example 1. The fluorescent material particles of Example 1 have a specific plate-like shape. This is consistent with their higher needles degree described above. This is believed to be because, for example, calcium fluoride used in Example 1 changed the reactivity of the raw material particles, the particles grew in a specific direction while increasing their crystallinity.

Example 11

A light emitting device 100 including a fluorescent member 50 containing a fluorescent material 70, a resin, and a light-emitting element 10 was prepared. The fluorescent material 70 included the nitride fluorescent material E1 obtained in Example 1 as the first fluorescent material 71, and a fluorescent material having a composition $Y_3(Al,Ga)_5O_{12}:Ce$ as the second fluorescent material 72. The first fluorescent material 71 and the second fluorescent material 72 were combined such that the chromaticity coordinates (x, y) of the luminescent color were around x=0.459, y=0.410 (color temperature of around 2700 K). As the light-emitting element 10, an LED having a peak light emission wavelength of 455 nm was used. For the light emitting device 100, the chromaticity coordinates, the luminous flux ratio, and the average of rendering index Ra were determined. The luminous flux of the light emitting device 100 was determined using a total luminous flux integral measuring device.

Examples 12 to 15, Comparative Examples 11 to 15

Figure 5:
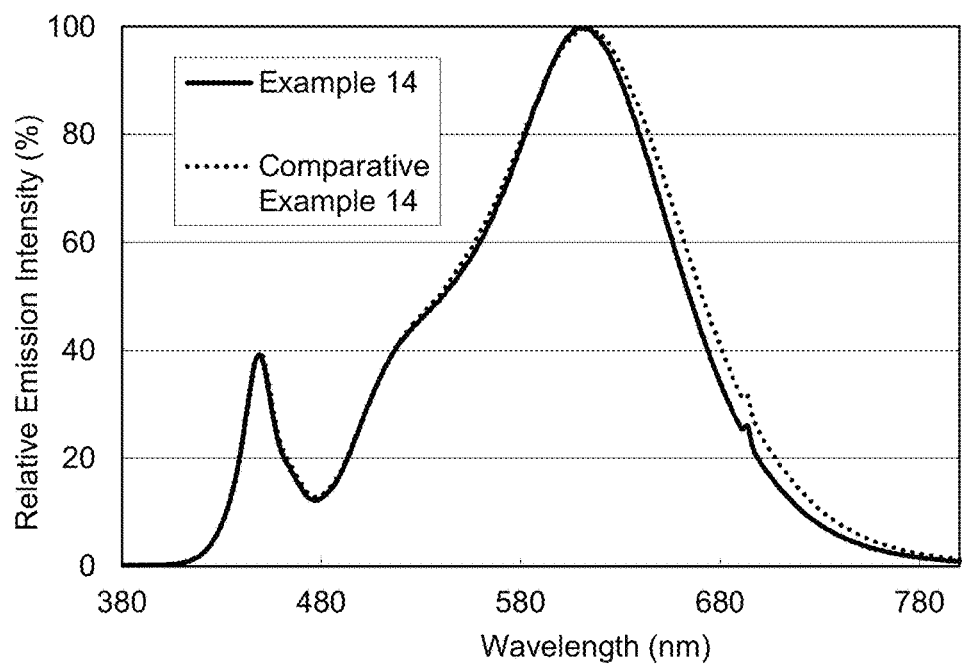
FIG. 5 shows emission spectra of a light emitting device according to an embodiment of the present disclosure and a comparative light emitting device.

Light emitting devices 100 were each prepared in the same manner as Example 11 except that the types of nitride fluorescent materials were changed as shown in Table 4. FIG. 5 shows the emission spectra showing the relative emission intensity versus wavelength of light emitting devices obtained in Example 14 and Comparative Example 14.

TABLE 4

| | Nitride fluorescent material | Chromaticity coordinates | | Luminous flux ratio (%) | Ra |
|---|---|---|---|---|---|
| | | x | y | | |
| Example 11 | E1 | 0.459 | 0.410 | 101.3 | 78.2 |
| Comparative Example 11 | C1 | 0.459 | 0.410 | 100.0 | 78.0 |
| Example 12 | E2 | 0.460 | 0.410 | 101.9 | 82.0 |
| Comparative Example 12 | C2 | 0.459 | 0.410 | 100.0 | 81.3 |
| Example 13 | E3 | 0.461 | 0.410 | 102.2 | 84.9 |

TABLE 4-continued

| | Nitride fluorescent material | Chromaticity coordinates | | Luminous flux ratio (%) | Ra |
|---|---|---|---|---|---|
| | | x | y | | |
| Comparative Example 13 | C3 | 0.459 | 0.410 | 100.0 | 83.6 |
| Example 14 | E4 | 0.459 | 0.410 | 106.7 | 86.1 |
| Comparative Example 14 | C4 | 0.459 | 0.410 | 100.0 | 87.0 |
| Example 15 | E5 | 0.459 | 0.410 | 105.7 | 88.1 |
| Comparative Example 15 | C5 | 0.460 | 0.410 | 100.0 | 87.8 |

As shown in Table 4, the light emitting devices of Examples 11 to 15, which respectively include the nitride fluorescent materials E1 to E5, each have a luminous flux ratio higher by 1% to 7% than the luminous flux ratio of the corresponding light emitting devices of Comparative Example 11 to 15, which respectively include the nitride fluorescent materials C1 to C5. As for average of rendering index Ra, Examples 11, 12, 13, and 15 each have higher values than the corresponding Comparative Examples 11, 12, 13, and 15. The emission properties of the nitride fluorescent material E1 of Example 1 and the nitride fluorescent material C1 of Comparative Example 1 shown in Table 1 are approximately the same. Nevertheless, the light emitting device of Example 11, which includes the nitride fluorescent material E1 having a particle shape with a needle degree in a specific range, shows an improved luminous flux ratio. This is believed to be because the light emission of the fluorescent material and the light emitting component of the light-emitting element are more easily taken out from the light emitting device of Example 11, which includes the nitride fluorescent material E1, than the light emitting device Comparative Example 11, which includes the nitride fluorescent material C1. Further, the luminous flux ratio of Example 14 is much higher than that of Comparative Example 14. In addition to the effect of the needle degree, the fact of Example 14 having a narrower half bandwidth as shown in the emission spectrum of the fluorescent material of FIG. 2, and having less long wavelength components, which are disadvantageous to visibility, is also believed to have contributed to the much higher luminous flux.

Examples 16 to 20, Comparative Example 16

Figure 6:
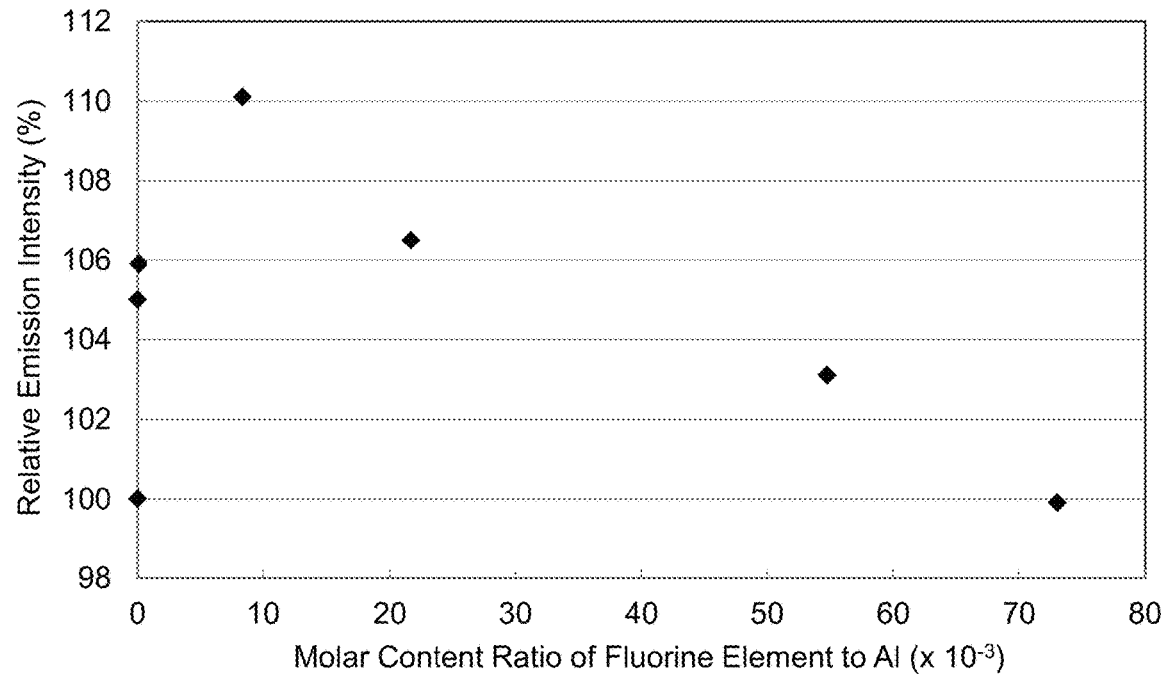
FIG. 6 is a graph showing the relationship of relative emission intensity and molar content ratio of fluorine element in nitride fluorescent materials.

Nitride fluorescent materials E16 to 20, and C16 were obtained under the same conditions as in Example 1 except that the initial charged amount ratio of the respective raw materials was changed as shown in Table 5. Table 5 shows the volume average particle diameter, the peak wavelength (λp: nm), and the relative emission intensity relative to that of Comparative Example 3 (relative Ip: %), the molar content ratio of fluorine element (F) to Al in each resultant nitride fluorescent material. Table 5 also shows the results of Comparative Example 3. FIG. 6 shows the relationship between the relative emission intensity and the molar content ratio of fluorine element to Al.

TABLE 5

| | Initial charged amount ratio (mol) | | | | | | Nitride fluorescent material | Volume average particle diameter (μm) | Emission properties | | F molar content ratio |
|---|---|---|---|---|---|---|---|---|---|---|---|
| | Ca(N) | Ca(F) | Sr | Eu | Al | Si | F | | | λp (nm) | Relative Ip(%) | |
| Comparative Example 3 | 0.148 | 0 | 0.837 | 0.015 | 0.9 | 1 | 0 | C3 | 15.2 | 627 | 100.0 | 0 |

TABLE 5-continued

| | Initial charged amount ratio (mol) | | | | | | Nitride fluorescent material | Volume average particle diameter (μm) | Emission properties | | F molar content ratio |
|---|---|---|---|---|---|---|---|---|---|---|---|
| | Ca(N) | Ca(F) | Sr | Eu | Al | Si | F | | | λp (nm) | Relative lp(%) | |
| Example 16 | 0.133 | 0.015 | 0.837 | 0.015 | 0.9 | 1 | 0.030 | E16 | 15.5 | 631 | 105.0 | >0 |
| Example 17 | 0.118 | 0.030 | 0.837 | 0.015 | 0.9 | 1 | 0.059 | E17 | 15.1 | 631 | 105.9 | 1.0E−04 |
| Example 18 | 0.089 | 0.059 | 0.837 | 0.015 | 0.9 | 1 | 0.118 | E18 | 15.7 | 630 | 110.1 | 8.4E−03 |
| Example 19 | 0.059 | 0.089 | 0.837 | 0.015 | 0.9 | 1 | 0.177 | E19 | 15.7 | 632 | 106.5 | 2.2E−02 |
| Example 20 | 0.030 | 0.118 | 0.837 | 0.015 | 0.9 | 1 | 0.236 | E20 | 14.1 | 630 | 103.1 | 5.5E−02 |
| Comparative Example 16 | 0 | 0.148 | 0.837 | 0.015 | 0.9 | 1 | 0.296 | C16 | 14.2 | 632 | 99.9 | 7.3E−02 |

As shown in Table 5, the nitride fluorescent materials obtained in Examples 16 to 20 each have higher relative emission intensity and higher emission efficiency than the nitride fluorescent materials obtained in Comparative Examples 3 and 16. Although a fluorine element was detected in the nitride fluorescent material obtained in Example 16, the molar content ratio of the fluorine element was less the quantitative limit.

Examples 21 to 25, Comparative Example 17

Light emitting devices 100 were each prepared in the same manner as Example 11 except that the types of the nitride fluorescent materials were changed as shown in Table 6. Table 6 shows the chromaticity coordinates, the luminous flux ratio, and the average of rendering index Ra of each resultant light emitting device. Each luminous flux ratio was relative to the luminous flux ratio of Comparative Example 13.

TABLE 6

| | Nitride fluorescent material | Chromaticity coordinates | | Luminous flux ratio (%) | Ra |
|---|---|---|---|---|---|
| | | x | y | | |
| Comparative Example 13 | C3 | 0.460 | 0.410 | 100.0 | 83.6 |
| Example 21 | E16 | 0.460 | 0.410 | 102.5 | 85.0 |
| Example 22 | E17 | 0.460 | 0.410 | 102.8 | 84.9 |
| Example 23 | E18 | 0.460 | 0.410 | 103.0 | 85.2 |
| Example 24 | E19 | 0.460 | 0.410 | 102.3 | 85.6 |
| Example 25 | E20 | 0.460 | 0.410 | 101.2 | 85.5 |
| Comparative Example 17 | C16 | 0.460 | 0.410 | 99.8 | 85.8 |

As shown in Table 6, the light emitting devices of Examples 21 to 25, which respectively include the nitride fluorescent materials E16 to E20, have a luminous flux ratio higher by 1% to 3% than the luminous flux ratio of the light emitting device of Comparative Example 13, which includes the nitride fluorescent material C3, and the luminous flux ratio of the light emitting device of Comparative Example 17, which includes the nitride fluorescent material C16. As for the average of rendering index Ra, Examples 21 to 25 showed a higher value than Comparative Example 13.

As described above, using the nitride fluorescent material of an embodiment of the present disclosure produces a light emitting device with high emission efficiency.

The light emitting device including a nitride fluorescent material according to this disclosure can be suitably used, for example, as a light source for lighting. In particular, the light emitting device can be advantageously used, for example, for illumination light sources, LED displays, liquid crystal backlight light sources, traffic light, illumination type switches, various sensors, and various indicators using a light emitting diode as an excitation light source to achieve high light emission properties.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A nitride fluorescent material comprising silicon nitride particles comprising Eu, at least one alkaline earth metal selected from the group consisting of Mg, Ca, Sr, and Ba, Al, and fluorine in a composition of the silicon nitride particles,
wherein the silicon nitride particles have a needle degree, which is an average of a ratio of major diameter to minor diameter, ranging from 1.4 to 1.8, a volume average particle diameter of 10 μm or more, and a molar content ratio of fluorine atom to Al of $6 \times 10^{-2}$ or less,
wherein the silicon nitride particles have a composition represented by formula (I) below:

$$M^a{}_s Sr_t Eu_u Si_v Al_w N_x O_y F_z \qquad (I)$$

wherein $M^a$ is at least one element selected from the group consisting of Ca, Ba and Mg, and s, t, u, v, w, x, y, and z satisfy $0 < s \leq 1$, $0 \leq t < 1$, $0 < u \leq 0.04$, $0.8 \leq s+t+u \leq 1.1$, $0.8 \leq v \leq 1.2$, $0.8 \leq w \leq 1.2$, $1.8 \leq v+w \leq 2.2$, $2.5 \leq 3.2$, $0 \leq y \leq 0.5$, $0 < z \leq 0.06$, and $2.5 \leq x+y+z \leq 3.2$.

2. The nitride fluorescent material according to claim 1, wherein $M^a$ contains Ca, and $0 < s \leq 0.5$, $0.5 \leq t < 1$, and $0.005 \leq u \leq 0.03$ are satisfied.

3. The nitride fluorescent material according to claim 1, further comprising an oxygen component, wherein a molar content ratio of oxygen atom to Al ranges from $5 \times 10^{-2}$ to $5 \times 10^{-1}$.

4. The nitride fluorescent material according to claim 1, wherein the silicon nitride particles have a value obtained by dividing the needle degree by the volume average particle diameter ranging from 0.085 to 0.13.

5. The nitride fluorescent material according to claim 1, wherein the molar content ratio of fluorine atom to Al is $1.5 \times 10^{-2}$ or less.

6. A light emitting device comprising:
a fluorescent member comprising a fluorescent material comprising the nitride fluorescent material according to claim 1, and
a light-emitting element having a peak light emission wavelength ranging from 380 nm to 470 nm.

7. The light emitting device according to claim 6, further comprising another fluorescent material containing at least one fluorescent material having a composition represented by a formula selected from the group consisting of formulas (IIa) to (IIi):

$$(Y,Gd,Tb,Lu)_3(Al,Ga)_5O_{12}:Ce \qquad (IIa)$$

$$(Ba,Sr,Ca)_2SiO_4:Eu \qquad (IIb)$$

$$Si_{6-p}Al_pO_pN_{8-p}:Eu(0<p\leq4.2) \qquad (IIc)$$

$$(Ca,Sr)_8MgSi_4O_{16}(Cl,F,Br)_2:Eu \qquad (IId)$$

$$(La,Y)_3Si_6N_{11}:Ce \qquad (IIe)$$

$$(Ba,Sr,Ca)Ga_2S_4:Eu \qquad (IIf)$$

$$(Ba,Sr,Ca)_2Si_5N_8:Eu \qquad (IIg)$$

$$(Sr,Ca,Ba)LiAl_3N_4:Eu \qquad (IIh)$$

$$K_2(Si,Ge,Ti)F_6:Mn \qquad (IIi).$$

* * * * *